US008716737B2

United States Patent
Lin et al.

(10) Patent No.: US 8,716,737 B2
(45) Date of Patent: May 6, 2014

(54) DIE-BONDED LED

(75) Inventors: Hsiu Jen Lin, Hsinchu County (TW); Jian Shian Lin, Yilan County (TW); Shau Yi Chen, Yunlin County (TW); Chieh Lung Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/530,396

(22) Filed: Jun. 22, 2012

(65) Prior Publication Data

US 2012/0256228 A1 Oct. 11, 2012

Related U.S. Application Data

(62) Division of application No. 12/854,278, filed on Aug. 11, 2010, now Pat. No. 8,236,687.

(30) Foreign Application Priority Data

Nov. 27, 2009 (TW) .............................. 98140702 A

(51) Int. Cl.
*H01L 33/00* (2010.01)
*H01L 21/00* (2006.01)
*H01L 23/532* (2006.01)
*H01L 23/00* (2006.01)
*H01L 33/30* (2010.01)
*H01L 33/40* (2010.01)
*H01L 33/48* (2010.01)
*H01L 33/62* (2010.01)

(52) U.S. Cl.
CPC .......... *H01L 23/53247* (2013.01); *H01L 24/29* (2013.01); *H01L 24/83* (2013.01); *H01L 33/30* (2013.01); *H01L 33/40* (2013.01); *H01L 33/0095* (2013.01); *H01L 33/486* (2013.01); *H01L 33/62* (2013.01); *H01L 2224/8382* (2013.01)
USPC ............... 257/98; 257/99; 257/432; 257/762; 257/E25.019; 257/E21.077; 438/29; 438/644; 438/650; 438/660

(58) Field of Classification Search
CPC ..... H01L 23/5324; H01L 33/30; H01L 33/40; H01L 33/0095; H01L 33/486; H01L 33/62; H01L 24/83
USPC ........ 257/98, 99, 431–432, 762, 772; 438/26, 438/29, 118, 628, 644, 650, 654, 660
See application file for complete search history.

(56) References Cited

U.S. PATENT DOCUMENTS 8,110,437 B2 * 2/2012 Waitl et al. .................... 438/106
8,236,687 B2 * 8/2012 Lin et al. ....................... 438/660

(Continued)

FOREIGN PATENT DOCUMENTS

CN 101501872 A 8/2009
EP 1717854 A2 11/2006

(Continued)

OTHER PUBLICATIONS

Japan Patent Office, "Office Action", Japan.

(Continued)

*Primary Examiner* — Alonzo Chambliss
(74) *Attorney, Agent, or Firm* — Morris Manning & Martin LLP; Tim Tingkang Xia, Esq.

(57) ABSTRACT

An LED includes a first intermetallic layer, a first metal thin film layer, an LED chip, a substrate, a second metal thin film layer, and a second intermetallic layer. The first metal thin film layer is located on the first intermetallic layer. The LED chip is located on the first metal thin film layer. The second metal thin film layer is located on the substrate. The second intermetallic layer is located on the second metal thin film layer, and the first intermetallic layer is located on the second intermetallic layer. Materials of the first and the second metal thin film layer are selected from a group consisting of Au, Ag, Cu, and Ni. Materials of the intermetallic layers are selected from a group consisting of a Cu—In—Sn intermetallics, an Ni—In—Sn intermetallics, an Ni—Bi intermetallics, an Au—In intermetallics, an Ag—In intermetallics, an Ag—Sn intermetallics, and an Au—Bi intermetallics.

3 Claims, 8 Drawing Sheets

(56) References Cited

U.S. PATENT DOCUMENTS

| | | |
|---|---|---|
| 2003/0010975 A1 | 1/2003 | Gibb et al. |
| 2004/0211060 A1 | 10/2004 | Suga et al. |
| 2005/0161813 A1* | 7/2005 | Pammer et al. ............... 257/737 |
| 2006/0105478 A1 | 5/2006 | Camras et al. |
| 2006/0138532 A1 | 6/2006 | Okamoto et al. |
| 2008/0003777 A1 | 1/2008 | Slater et al. |
| 2008/0093620 A1 | 4/2008 | Lee et al. |
| 2009/0134501 A1 | 5/2009 | Ganitzer et al. |
| 2009/0261377 A1 | 10/2009 | Tu |
| 2010/0012955 A1* | 1/2010 | Sorg et al. ....................... 257/88 |

FOREIGN PATENT DOCUMENTS

| | | | |
|---|---|---|---|
| EP | 1748480 | A1 | 1/2007 |
| JP | 2004202581 | A | 7/2004 |
| JP | 2006237215 | A | 9/2006 |
| JP | 2007109829 | A | 4/2007 |
| JP | 2007300489 | A | 11/2007 |
| JP | 2009111080 | A | 5/2009 |
| JP | 2009188176 | A | 8/2009 |
| TW | 200835766 | | 9/2008 |
| TW | 200939526 | | 9/2009 |

OTHER PUBLICATIONS

Ervina Efzan Mhd Noor et al., Characteristic of Low Temperature of Bi-In-Sn Solder alloy, 33rd International Electronics Manufacturing Technology Conference, 2008, p. 1-4.

Intellectual Property Office, Ministry of Economic Affairs, R.O.C., "Office Action", Nov. 27, 2012, Taiwan.

European Patent Office, "Office Action", Mar. 7, 2013.

* cited by examiner

DIE-BONDED LED

CROSS-REFERENCE TO RELATED APPLICATIONS

This application is a divisional patent application U.S. application Ser. No. 12/854,278 filed on Aug. 11, 2010, for "Die-bonding method of LED chip and LED manufactured by the same". This application is also claims priority under 35 U.S.C. §119(a) on Patent Application No(s). 098140702 filed in Taiwan, R.O.C. on Nov. 27, 2009. Each of theses application is incorporated herein by reference in its entirety.

BACKGROUND

1. Technical Field

The present disclosure relates to an LED having a die-bonded structure.

2. Related Art

The technology of adhering an LED chip to a lead frame has been developed for many years. Die-bonding materials are approximately divided into two categories: one is high molecular conductive glue materials, and the other is metal welding materials.

The first category can be seen in ROC Patent No. 463394 entitled "CHIP-TYPE LED AND MANUFACTURING METHOD THEREOF". The method mainly includes: plating silver paste on a surface of a metal substrate, forming a plurality of lead frames after etching, die-bonding one end of the lead frame and connecting it to the opposite end by wire bonding, performing glue sealing and dicing so as to form a chip-type LED, in which lead frames exposed at the bottom form electrical contacts. In such practice, if glue is not spread uniformly in the bonding process, the die will not be fixed at the preset position, thereby influencing the luminous efficiency. Next, in such die-bonding method, since the high molecular material has extremely low heat resistance, the silver paste bonding layer is easily deteriorated in operation at a high temperature. Further, since the high molecular material has low heat conductivity, the LED die cannot obtain a desirable heat dissipation effect due to the low heat conductivity (the heat conductivity coefficient of the silver paste is only 1 W/M-K). The life and photoelectric conversion efficiency of the LED die are reduced as well.

The second category can be seen in ROC Patent Application Publication No. 200840079 entitled "DIE-BONDING MATERIAL AND METHOD OF LED PACKAGE". The die-bonding method used in the patent application mainly adopts eutectic bonding based on the metal material of a substrate. First, a layer of eutectic bonding material in an appropriate range is coated on an upper surface of the metal substrate of the package structure. Then, an LED die is disposed on the eutectic bonding material of the substrate. The finished product passes through a hot plate, an oven, or a tunnel furnace to have an appropriate temperature, so as to accomplish the eutectic bonding. This technology employs the eutectic bonding material, and forms a bonding layer of a metal material, and thus achieves better heat dissipation and heat resistance than the silver paste. A part of the eutectic bonding material employed in this patent technology has a high melting point, so that thermal stress easily remains on the LED die in bonding, which damages the die. Although the other part of the eutectic bonding material is a low melting point alloy, after bonding of such bonding material is completed, if the LED is used in an environment of 70-80° C., the bonding layer will be softened, and the contact reliability is greatly impaired.

In addition to the above technologies, US Patent Application Publication No. 2007/0141749 has disclosed introducing ultrasonic waves in the die-bonding process and ionizing the bonding surface by the ultrasonic waves, so as to lower the heating temperature and reduce the thermal stress. This method requires the addition of ultrasonic equipment, which increases the manufacturing cost. Meanwhile, if the ultrasonic waves are operated improperly, the LED die may be vibrated directly to be cracked.

SUMMARY

According to an embodiment, an LED comprises a first intermetallic layer, a first metal thin film layer, an LED chip, a substrate, a second metal thin film layer, and a second intermetallic layer. The first metal thin film layer is located on the first intermetallic layer. The LED chip is located on the first metal thin film layer. The second metal thin film layer is located on the substrate. The second intermetallic layer is located on the second metal thin film layer, and the first intermetallic layer is located on the second intermetallic layer. A material of the first metal thin film layer and a material of the second metal thin film layer are selected from a group consisting of Au, Ag, Cu, and Ni. Materials of the intermetallic layers are selected from a group consisting of a Cu—In—Sn intermetallics, an Ni—In—Sn intermetallics, an Ni—Bi intermetallics, an Au—In intermetallics, an Ag—In intermetallics, an Ag—Sn intermetallics, and an Au—Bi intermetallics.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

Figure 1:
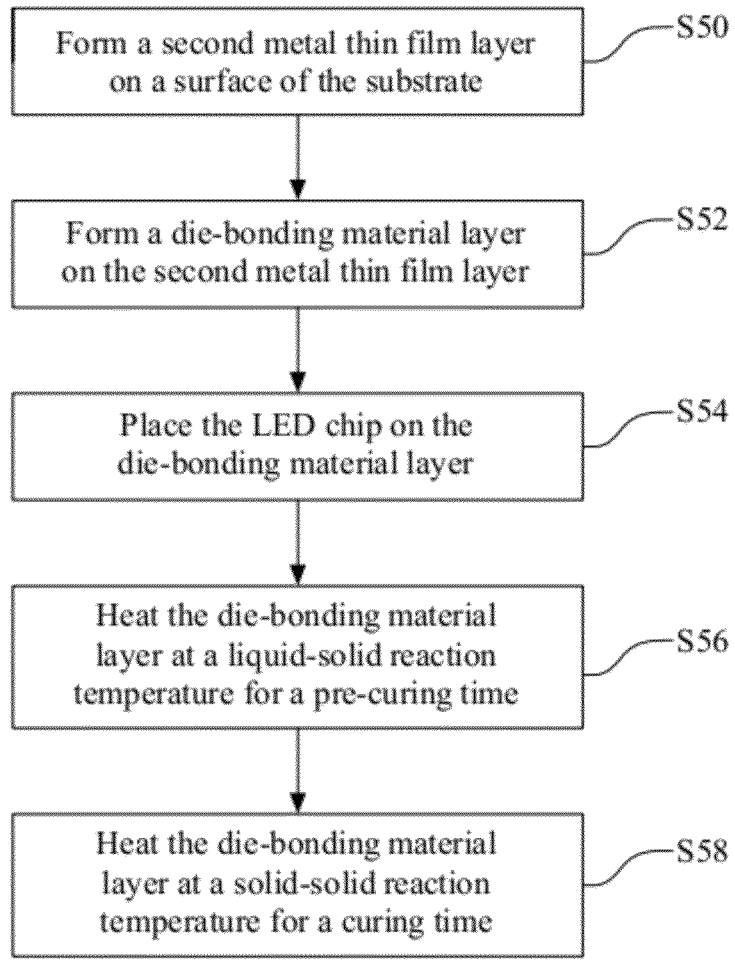
FIG. 1 is a schematic flow chart of a die-bonding method of an LED chip according to an exemplary embodiment.
Figure 2A:
FIG. 2A is a schematic structural view of an LED chip in the die-bonding method according to an exemplary embodiment.

FIG. 1 is a schematic flow chart of a die-bonding method of an LED chip according to an exemplary embodiment. FIG. 2A is a schematic structural view of an LED chip in the die-bonding method according to an exemplary embodiment.

Figure 2B:
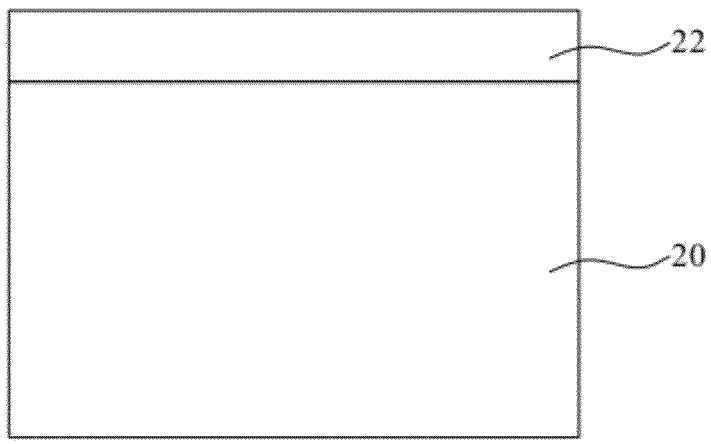
FIG. 2B is a schematic structural view of a substrate in the die-bonding method according to an exemplary embodiment.

FIG. 2B is a schematic structural view of a substrate in the die-bonding method according to an exemplary embodiment.

Referring to FIGS. 1, 2A, and 2B, the die-bonding method of the LED chip is suitable for bonding the LED chip 10 and the substrate 20. The LED chip 10 may be an LED having a p-i-n structure, for example, but not limited to, GaN, GaInN, AlInGaP, AlInGaN, AN, InN, GaInAsN, GaInPN, or a combination thereof.

The spectrum of light emitted by the LED chip 10 may be any visible light spectrum (380 nm to 760 nm) or other spectrums. The LED chip 10 may be formed as a horizontal structure (Sapphire base), a vertical structure (Thin-GaN LED), or a Flip-Chip.

The LED chip 10 has a first metal thin film layer 12. A material of the first metal thin film layer 12 may be Au, Ag, Cu, or Ni. The first metal thin film layer 12 may be plated on a surface of the LED chip 10 by electroplating, sputtering, or evaporation. A thickness of the first metal thin film layer 12 may be, but not limited to, 0.2 μm to 2.0 μm. For example, the thickness is 0.5 μm to 1.0 μm.

In the LED chip 10 having the first metal thin film layer 12, the first metal thin film layer 12 is usually not directly plated on the diced chip; instead, the first metal thin film layer 12 is plated on a back side of an LED wafer by electroplating or other methods, and then the wafer is diced and split.

The substrate 20 may be a lead frame, a printed circuit board (PCB), a substrate having a plastic reflective cup, or a ceramic substrate. A material of the substrate 20 may be a pure element such as Cu, Al, Fe, or Ni or an alloy added with a small amount of other elements. The material of the substrate 20 may also be Si, AN, or low-temperature cofired ceramics (LTCC).

Reference is made to FIG. 1 as well as FIGS. 2B, 2C, 2D, 2E, and 2F for the die-bonding method of the LED chip 10. As can be known from the figures, the die-bonding method of the LED chip 10 comprises the following steps.

In Step S50, a second metal thin film layer 22 is formed on a surface of the substrate 20 (as shown in FIG. 2B).

Figure 2C:
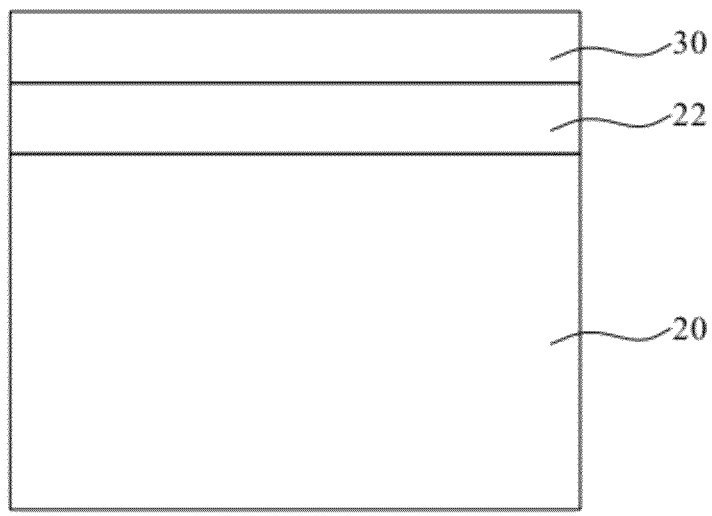
FIG. 2C is a schematic structural view of the substrate on which Step S52 is performed in the die-bonding method according to an exemplary embodiment.

In Step S52, a die-bonding material layer 30 is formed on the second metal thin film layer 22, in which a melting point of the die-bonding material layer 30 is lower than 100° C. (as shown in FIG. 2C).

Figure 2D:
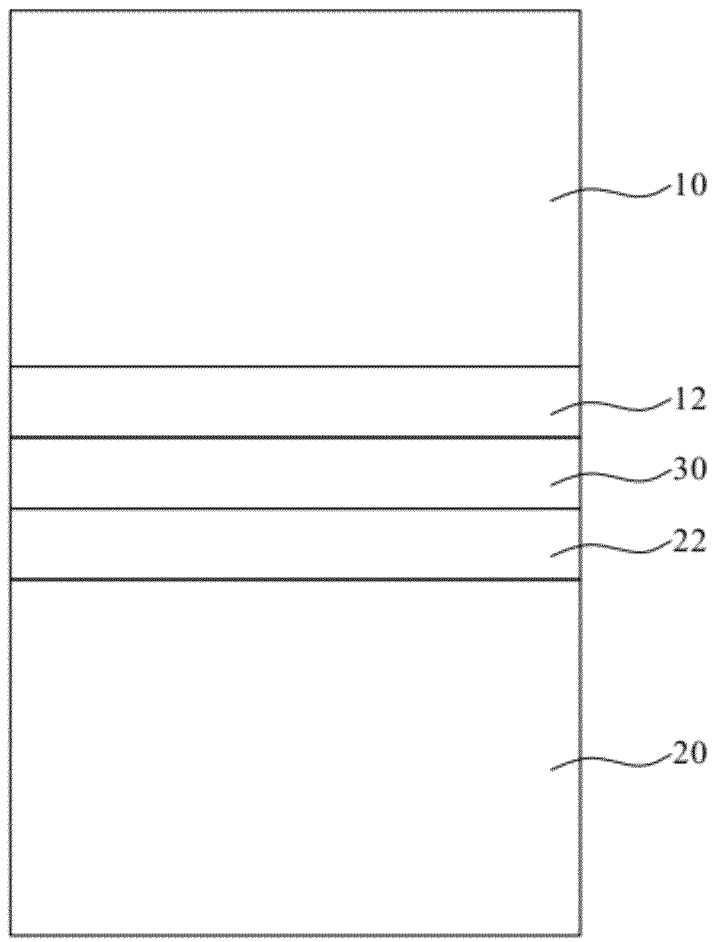
FIG. 2D is a schematic structural view of Step S54 in the die-bonding method according to an exemplary embodiment.

In Step S54, the LED chip 10 is placed on the die-bonding material layer 30 with the first metal thin film layer 12 contacting the die-bonding material layer 30 (as shown in FIG. 2D).

Figure 2E:
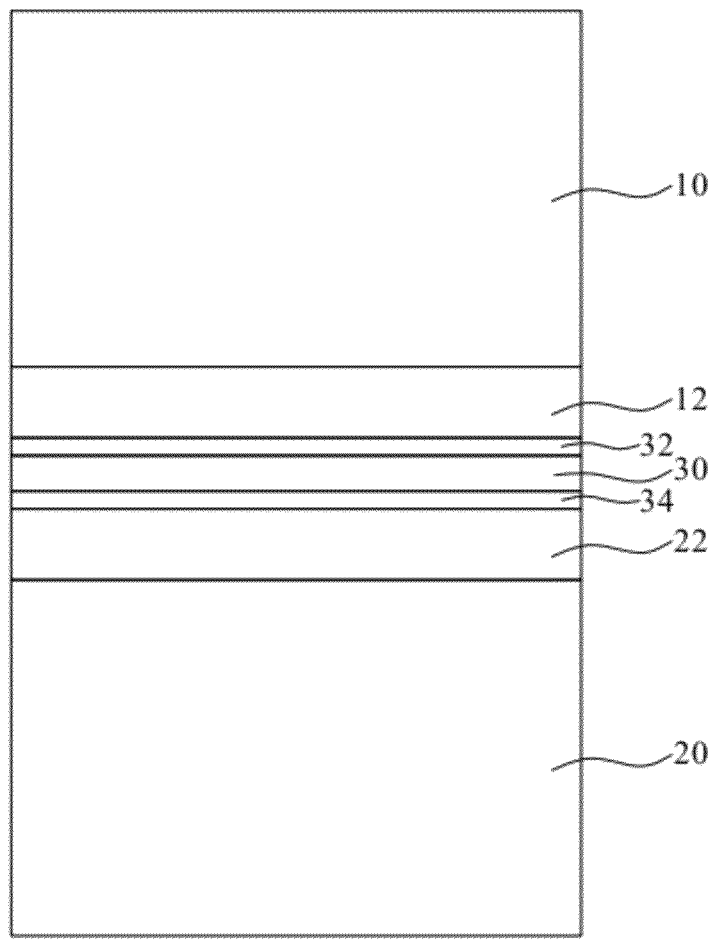
FIG. 2E is a schematic view of an LED structure in Step S56 in the die-bonding method according to an exemplary embodiment.

In Step S56, the die-bonding material layer 30 is heated at a liquid-solid reaction temperature for a pre-curing time, so as to respectively form a first intermetallic layer 32 and a second intermetallic layer 34 between the first metal thin film layer 12, the die-bonding material layer 30, and the second metal thin film layer 22 (as shown in FIG. 2E).

Figure 2F:
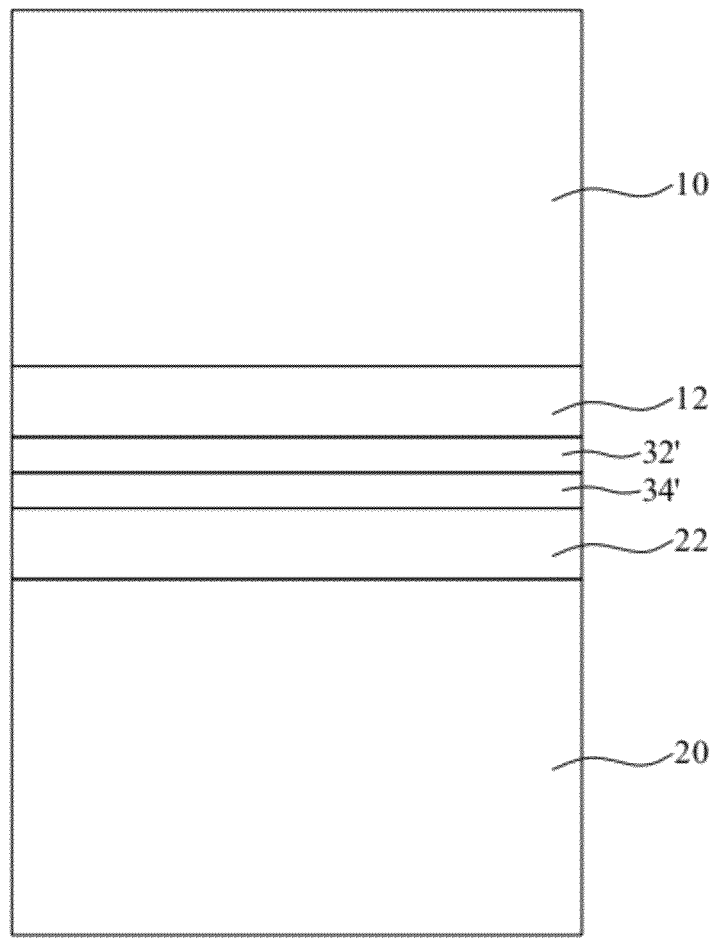
FIG. 2F is a schematic view of an LED structure in Step S58 in the die-bonding method according to an exemplary embodiment.

In Step S58, the die-bonding material layer 30 is heated at a solid-solid reaction temperature for a curing time, so as to perform a solid-solid reaction, in which a melting point of the first intermetallic layer 32' and the second intermetallic layer 34' after the solid-solid reaction is higher than 200° C. (as shown in FIG. 2F).

Reference is made to FIG. 2B for Step S50. The second metal thin film layer 22 may be formed on the substrate 20 by a process such as electroplating, sputtering, or evaporation. A material of the second metal thin film layer 22 may be Au, Ag, Cu, or Ni. A thickness of the second metal thin film layer 22 may be, but not limited to, 0.2 μm to 2.0 μm. For example, the thickness is 0.5 μm to 1.0 μm.

Referring to FIG. 2C, subsequent to Step S50, in Step S52, a die-bonding material layer 30 may be formed on the second metal thin film layer 22 by electroplating, evaporation, sputtering, or placing solder paste. A material of the die-bonding material layer 30 may be Bi—In, Bi—In—Sn, Bi—In—Sn—Zn, or Bi—In—Zn. A melting point of Bi—In is about 110° C., a melting point of Bi-25In-18Sn is about 82° C., a melting point of Bi-20In-30Sn-3Zn is about 90° C., and a melting point of Bi-33In-0.5Zn is about 110° C. A thickness of the die-bonding material layer 30 may be, but is not limited to, 0.2 μm to 2.0 μm. For example, the thickness is 0.5 μm to 1.0 μm.

Referring to FIG. 2D, in Step S54, the LED chip 10 is placed on the die-bonding material layer 30 with the first metal thin film layer 12 contacting the die-bonding material layer 30, as shown in FIG. 2D.

Then, Step S56 is performed in which the die-bonding material layer 30 is heated at a liquid-solid reaction temperature for a pre-curing time, so as to respectively form a first intermetallic layer 32 and a second intermetallic layer 34 between the first metal thin film layer 12, the die-bonding material layer 30, and the second metal thin film layer 22 (as shown in FIG. 2E). The liquid-solid reaction temperature may be equal to or higher than a melting temperature of the die-bonding material layer 30. If the material of the die-bonding material layer 30 is Bi—In—Sn, the liquid-solid reaction temperature may be 82° C. or more. The heating manner may be laser heating, hot air heating, infrared heating, thermocompression bonding, or ultrasonic assisted thermocompression bonding.

The ambient temperature may be directly raised to the liquid-solid reaction temperature, or the die-bonding material layer 30 may be directly heated, or the substrate 20 may be directly heated and then heat may transfer to the die-bonding material layer 30. Heating is performed at, for example, but not limited to, the bottom of the substrate 20 directly by laser (i.e., heating is performed below the substrate 20 as shown in FIG. 2E).

The heating time (the pre-curing time) may be, but is not limited to, 0.1 second to 2 seconds, for example, 0.2 second to 1 second. The heating time may be appropriately adjusted depending on the condition of the liquid-solid reaction. The heating time may be the time taken for forming the first intermetallic layer 32 and the second intermetallic layer 34 respectively between the first metal thin film layer 12, the die-bonding material layer 30, and the second metal thin film layer 22. Step S56 can be construed as completed even if the formed first intermetallic layer 32 and second intermetallic layer 34 are very thin. That is to say, as long as the first intermetallic layer 32 and the second intermetallic layer 34 are formed between the first metal thin film layer 12, the die-bonding material layer 30, and the second metal thin film layer 22, i.e., the bonding effect is produced, Step S56 can be stopped to proceed to the next step (S58). Definitely, increasing the pre-curing time to form more first intermetallic layers 32 and second intermetallic layers 34 in the process is also implementable.

The heating operation in Step S56 may also be referred to as a pre-curing procedure, which aims to pre-fix the LED chip 10 and the substrate 20 according to the current alignment, so as to facilitate the subsequent process. Since the temperature of the pre-curing procedure may be equal to slightly higher than the melting point of the die-bonding material layer 30, and the pre-curing time is quite short, the alignment can be effectively maintained without exerting any influence such as a thermal stress on the LED chip 10.

Materials of the formed first intermetallic layer 32 and second intermetallic layer 34 are related to the first metal thin film layer 12 and the second metal thin film layer 22, which will be described in detail later.

Finally, Step S58 is performed in which the die-bonding material layer 30 is heated at a solid-solid reaction temperature for a curing time, so as to perform a solid-solid reaction. The solid-solid reaction temperature may be lower than the melting point of the die-bonding material layer 30, and may be, but not limited to, 40 to 80° C. The curing time may be adjusted according to the solid-solid reaction temperature. For example, when the solid-solid reaction temperature is high, the curing time may be short. When the solid-solid reaction temperature is low, the curing time may be long. The curing time may be 30 minutes to 3 hours.

The solid-solid reaction aims to diffuse alloy elements of the die-bonding material layer 30 and elements of the first metal thin film layer 12 and the second metal thin film layer 22. The time of the solid-solid reaction may be determined as the time required for diffusing most of alloy elements in the die-bonding material layer 30.

Step S58 may be performed by batch operation in the actual application. That is to say, multiple semi-finished products obtained after Step S56 are gathered, and Step S58 is performed by hot air heating, oven heating, infrared heating, or hot plate heating unitedly.

Since the solid-solid reaction temperature in Step S58 is lower than the melting point of the die-bonding material layer 30, the alignment achieved in Step S56 is not influenced.

The LED formed after Step S58 has several possible structures. The first structure of the LED can be seen in FIG. 2F. As can be known from the figure, the LED comprises the substrate 20, the second metal thin film layer 22, the second intermetallic layer 34', the first intermetallic layer 32', the first metal thin film layer 12, and the LED chip 10 stacked in sequence. Materials of the first metal thin film layer 12 and the second metal thin film layer 22 are selected from a group consisting of Au, Ag, Cu, and Ni. Materials of the two intermetallic layers 32' and 34' comprise a Cu—In—Sn intermetallics (having a melting point above at least 400° C.), an Ni—In—Sn intermetallics (having a melting point above about 700° C.), an Ni—Bi intermetallics (having a melting point above at least 400° C.), an Au—In intermetallics (having a melting point above at least 400° C.), an Ag—In intermetallics (having a melting point above at least 250° C.), an Ag—Sn intermetallics (a melting point above at least 450° C.), and an Au—Bi intermetallics (having a melting point above at least 350° C.).

Next, it should be noted that, the materials of the first intermetallic layer 32 and the second intermetallic layer 34 formed in the pre-curing procedure (i.e., shown in FIG. 2E) may be different from those of the first intermetallic layer 32' and the second intermetallic layer 34' after the solid-solid reaction. In the pre-curing procedure, although the liquid-solid reaction temperature reaches the melting point of the die-bonding material layer 30, since Step S56 can be stopped immediately after the first intermetallic layer 32 and the second intermetallic layer 34 are formed, a part of alloy elements in the die-bonding material layer 30 are not diffused. For example, if the die-bonding material layer 30 contains In, In is easily diffused first to form an intermetallic layer during the liquid-solid reaction.

Three examples are listed below to show the materials of the second metal thin film layer 22, the second intermetallic layer 34', the first intermetallic layer 32', and the first metal thin film layer 12 of the LED shown in FIG. 2E in Steps S54, S56, and S58 in the pre-curing procedure.

[First Embodiment of LED Structure in FIG. 2E]

| Layer | Step S54 | Step S56 | Step S58 |
|---|---|---|---|
| First metal thin film layer | Ag | Ag | Ag |
| First intermetallic layer | No | Au—In, Ag—In, Ag—Sn, Au—Bi, or other intermetallics, for example, Ag$_2$In | Au—In, Ag—In, Ag—Sn, Au—Bi, or other intermetallics, for example, Ag$_2$In |
| Die-bonding material layer | Bi—In—Sn | Bi—In—Sn | No |
| Second intermetallic layer | No | Au—In, Ag—In, Ag—Sn, Au—Bi, or other intermetallics, for example, AuIn$_2$ | Au—In, Ag—In, Ag—Sn, Au—Bi, or other intermetallics, for example, Au$_2$Bi + AuIn$_2$ |
| Second metal thin film layer | Au | Au | Au |

[Second Embodiment of LED Structure in FIG. 2E]

| Layer | Step S54 | Step S56 | Step S58 |
|---|---|---|---|
| First metal thin film layer | Ni | Ni | Ni |
| First intermetallic layer | No | Ni—In—Sn, Ni—Bi, or other intermetallics | Ni—In—Sn, Ni—Bi, or other intermetallics |
| Die-bonding material layer | Bi—In—Sn | Bi—In—Sn | No |
| Second intermetallic layer | No | Ni—In—Sn, Ni—Bi, or other intermetallics | Ni—In—Sn, Ni—Bi, or other intermetallics |
| Second metal thin film layer | Ni | Ni | Ni |

[Third Embodiment of LED Structure in FIG. 2E]

| Layer | Step S54 | Step S56 | Step S58 |
|---|---|---|---|
| First metal thin film layer | Cu | Cu | Cu |
| First intermetallic layer | No | Cu—In—Sn intermetallics | Cu—In—Sn intermetallics |
| Die-bonding material layer | Bi—In—Sn | Bi—In—Sn | No |
| Second intermetallic layer | No | Cu—In—Sn intermetallics | Cu—In—Sn intermetallics |
| Second metal thin film layer | Cu | Cu | Cu |

Melting points of the first intermetallic layer 32' and the second intermetallic layer 34' in the first embodiment of the LED structure in FIG. 2E are both higher than 200° C. Even if the LED is operated at a temperature above 80° C. for a long time in the future, the bonding medium will not be softened, so that the alignment in the process can be maintained continuously to obtain a high luminous efficiency.

Figure 2G:
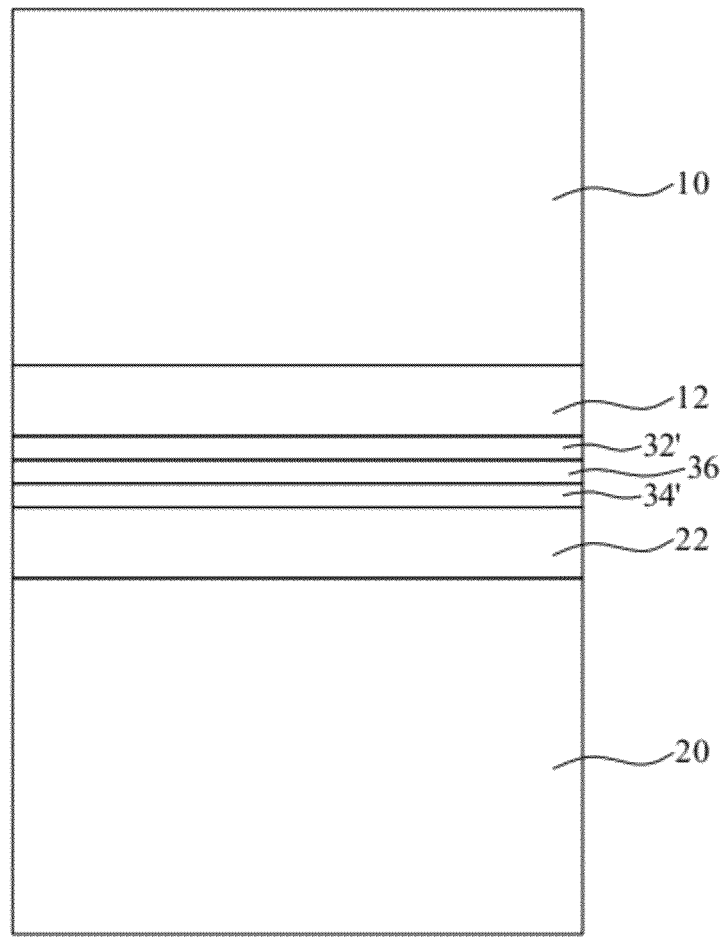
FIG. 2G is a schematic view of another LED structure in Step S58 in the die-bonding method according to an exemplary embodiment.

Another structure of the LED formed after Step S58 can be seen in FIG. 2G. As can be known from the figure, the LED comprises the substrate 20, the second metal thin film layer 22, the second intermetallic layer 34', an intermediate layer 36, the first intermetallic layer 32', the first metal thin film layer 12, and the LED chip 10 stacked in sequence. A material of the intermediate layer 36 is related to materials of the die-bonding material layer 30, the second intermetallic layer 34', and the first intermetallic layer 32'. If the material of the die-bonding material layer 30 is Bi—In—Sn, the material of the intermediate layer 36 is possibly Sn. That is, only Sn remains in the die-bonding material layer 30 after the solid-solid reaction.

Since a melting point of Sn is about 230° C. which is also higher than 200° C., the above purpose of not softening the LED in use can be achieved. That is to say, the die-bonding material layer 30 may disappear by reaction after the solid-solid reaction or remain to form the intermediate layer 36.

Figure 3:
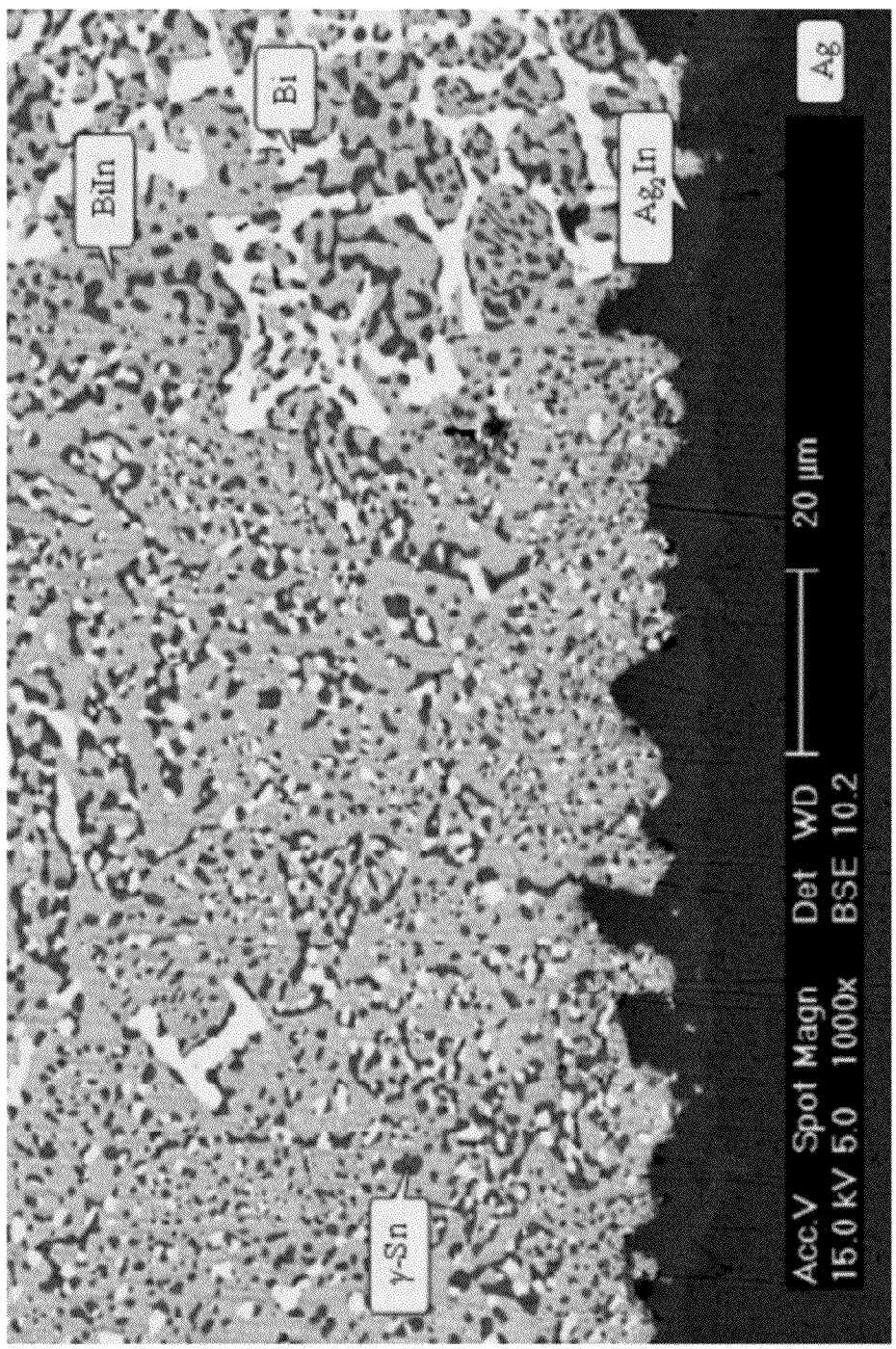
FIG. 3 is the microstructure of die-bonding material layer and a first metal thin film layer in the die-bonding method according to an exemplary embodiment.

The bonding state of Bi—In—Sn and Ag can be seen in FIG. 3. FIG. 3 is a microstructure of the die-bonding material layer 30 and the first metal thin film layer 12 in the die-bonding method according to an embodiment of the present disclosure. In this experiment, a Bi—In—Sn alloy of Bi-25In-18Sn is disposed on a silver plate, a temperature of 85° C. is applied for a period of time, and then alloy analysis is performed to obtain the microstructure. As can be seen from the figure, an $Ag_2In$ bonding layer is formed between the Bi—In—Sn and the Ag plate. Thereby, it can be known that, the die-bonding material layer 30 used in the present disclosure can form a bonding layer with silver at a low temperature.

It can be known from the embodiments of the die-bonding method and the LED structure after die-bonding that, the LED chip 10 can be pre-cured on the substrate 20 using a low temperature and a short time in the die-bonding process without the problem of misalignment. Afterwards, a solid-solid reaction is performed at a lower temperature. The first intermetallic layer 32' and the second intermetallic layer 34' after the reaction have high melting points (higher than 200° C.). Therefore, even if the LED after die-bonding is operated at a temperature higher than 80° C. for a long time, the first intermetallic layer 32' and the second intermetallic layer 34' will not be softened, and the alignment precision is not influenced. Further, since the temperatures used in the process are all far lower than 100° C., the problem that a thermal stress remains or is concentrated on the LED chip 10 and other components (such as the substrate 20 and the plastic reflective cup) will not occur in the die-bonding process. An LED having high reliability is obtained. Finally, since the pre-curing procedure can be performed by laser heating, the pre-curing time is shortened a lot. Moreover, since batch operation can be employed in the solid-solid reaction, the present die-bonding method can obtain a much higher throughput than the conventional art.

What is claimed is:

1. A light emitting diode (LED), comprising:
a first intermetallic layer;
a first metal thin film layer, located on the first intermetallic layer, wherein a material of the first metal thin film layer is Au, Ag, Cu, or Ni;
an LED chip, located on the first metal thin film layer;
a substrate;
a second metal thin film layer, located on the substrate, wherein a material of the second metal thin film layer is Au, Ag, Cu, or Ni; and
a second intermetallic layer, located on the second metal thin film layer, and the first intermetallic layer located on the second intermetallic layer, wherein materials of the first and second intermetallic layers are selected from the group consisting of a Cu—In—Sn intermetallics, an Ni—In—Sn intermetallics, an Ni—Bi intermetallics, an Au—In intermetallics, an Ag—In intermetallics, an Ag—Sn intermetallics, and an Au—Bi intermetallics,
wherein the first intermetallic layer and the second intermetallic layer are formed by heating a die-bonding material layer located between the first metal thin film layer and the second metal thin film layer, such that diffusion occurs between the first metal thin film layer and the die-bonding material layer to form the first intermetallic layer, and diffusion occurs between the second metal think film layer and the die-bonding material layer to form the second intermetallic layer; and
wherein a melting point of the die-bonding material is lower than 110° C., and a melting point of the first intermetallic layer and the second intermetallic layer is higher than 200° C.

2. The LED according to claim 1, further comprising an intermediate layer sandwiched between the first intermetallic layer and the second intermetallic layer, wherein a material of the intermediate layer is selected from the group consisting of Sn, Bi, In, and Zn, and wherein the intermediate layer is formed from the die-bonding material layer after heating.

3. A light emitting diode (LED), comprising:
a substrate;
a second metal thin film layer disposed on the substrate, wherein a material of the second metal thin film layer is Au, Ag, Cu, or Ni;
a second intermetallic layer disposed on the second metal thin film layer, wherein a material of the second intermetallic layer is Cu—In—Sn intermetallics, Ni—In—Sn intermetallics, Ni—Bi intermetallics, Au—In intermetallics, Ag—In intermetallics, Ag—Sn intermetallics, or Au—Bi intermetallics;
an intermediate layer disposed on the second intermetallic layer, wherein a material of the intermediate layer is Sn, Bi, In, or Zn;
a first intermetallic layer disposed on the intermediated layer, wherein a material of the second intermetallic layer is Cu—In—Sn intermetallics, Ni—In—Sn intermetallics, Ni—Bi intermetallics, Au—In intermetallics, Ag—In intermetallics, Ag—Sn intermetallics, or Au—Bi intermetallics;
a first metal thin film layer disposed on the first intermetallic layer, wherein a material of the first metal thin film layer is Au, Ag, Cu, or Ni; and
an LED chip disposed on the first metal thin film layer.

* * * * *